United States Patent
Zhao

(10) Patent No.: US 11,695,035 B2
(45) Date of Patent: Jul. 4, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Meng Zhao, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 131 days.

(21) Appl. No.: 17/212,904

(22) Filed: Mar. 25, 2021

(65) Prior Publication Data
US 2021/0320169 A1    Oct. 14, 2021

(30) Foreign Application Priority Data
Apr. 14, 2020  (CN) ............. 202010290935.3

(51) Int. Cl.
*H01L 29/66* (2006.01)
*H01L 29/78* (2006.01)
*H01L 29/06* (2006.01)

(52) U.S. Cl.
CPC .... *H01L 29/0619* (2013.01); *H01L 29/66545* (2013.01); *H01L 29/66553* (2013.01); *H01L 29/7848* (2013.01)

(58) Field of Classification Search
None
See application file for complete search history.

(56) References Cited

U.S. PATENT DOCUMENTS

| | | | | |
|---|---|---|---|---|
| 2010/0136761 A1* | 6/2010 | Han | ............ | H01L 29/6656 257/E21.409 |
| 2012/0181549 A1* | 7/2012 | Johnson | ............ | H01L 29/0847 257/77 |
| 2012/0181625 A1* | 7/2012 | Kwok | ............ | H01L 29/66628 257/E21.409 |
| 2013/0207166 A1* | 8/2013 | Chen | ............ | H01L 29/0847 257/288 |
| 2014/0077275 A1* | 3/2014 | Adam | ............ | H01L 29/66795 257/288 |
| 2016/0087037 A1* | 3/2016 | Cheng | ............ | H01L 29/0847 438/275 |
| 2018/0366580 A1* | 12/2018 | Zhou | ............ | H01L 21/02529 |

* cited by examiner

*Primary Examiner* — Joseph C. Nicely
*Assistant Examiner* — Lamont B Koo
(74) *Attorney, Agent, or Firm* — Anova Law Group, PLLC

(57) ABSTRACT

A semiconductor structure and a method for forming the semiconductor structure are provided. The semiconductor structure includes a substrate and a dummy gate structure on the substrate. The substrate contains source-drain openings on both sides of the dummy gate structure. The semiconductor structure also includes a first stress layer formed on a sidewall of a source-drain opening of the source-drain openings. Further, the semiconductor structure includes a second stress layer formed at a bottom of the source-drain opening and on the first stress layer. The second stress layer fully fills the source-drain opening, and stress of the first stress layer is less than stress of the second stress layer.

17 Claims, 5 Drawing Sheets

SEMICONDUCTOR STRUCTURE AND FABRICATION METHOD THEREOF

CROSS-REFERENCE TO RELATED APPLICATION

This application claims the priority of Chinese patent application No. 202010290935.3, filed on Apr. 14, 2020, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

With the rapid development of integrated circuit manufacturing technology, size of a semiconductor device in the integrated circuit continuously decreases, such that the operating speed of the entire integrated circuit is effectively improved. In an ultra-large scale integrated circuit, the carrier mobility of a transistor increases by applying stress on the transistor, to increase a driving current of the transistor.

However, the performance of the existing semiconductor device still needs to be improved. The disclosed methods and device structures are directed to solve one or more problems set forth above and other problems.

BRIEF SUMMARY OF THE DISCLOSURE

One aspect of the present disclosure includes a semiconductor structure. The semiconductor structure includes a substrate and a dummy gate structure on the substrate. The substrate contains source-drain openings on both sides of the dummy gate structure. The semiconductor structure also includes a first stress layer formed on a sidewall of a source-drain opening of the source-drain openings. Further, the semiconductor structure includes a second stress layer formed at a bottom of the source-drain opening and on the first stress layer. The second stress layer fully fills the source-drain opening, and stress of the first stress layer is less than stress of the second stress layer.

Optionally, the first stress layer is made of a same material as the second stress layer.

Optionally, when a to-be-formed semiconductor structure is a P-type device, both the first stress layer and the second stress layer are made of silicon germanium. A concentration of germanium in the first stress layer is a first concentration, and a concentration of germanium in the second stress layer is a second concentration. The first concentration is smaller than the second concentration.

Optionally, when a to-be-formed semiconductor structure is an N-type device, both the first stress layer and the second stress layer are made of silicon phosphide. A concentration of phosphorus in the first stress layer is a first concentration, and a concentration of phosphorus in the second stress layer is a second concentration. The first concentration is smaller than the second concentration.

Optionally, the first stress layer is doped with first ions, and the second stress layer is doped with second ions.

Optionally, a conductivity type of the first ions is opposite to a conductivity type of the second ions, or a conductivity type of the first ions is the same as a conductivity type of the second ions.

Optionally, the dummy gate structure includes a dummy gate dielectric layer on a portion of the substrate, a dummy gate electrode layer on the dummy gate dielectric layer, and a sidewall spacer on sidewall surfaces of the dummy gate dielectric layer and the dummy gate electrode layer. The source-drain opening exposes a bottom surface of the sidewall spacer.

Optionally, the semiconductor structure further includes a protection layer formed on the second stress layer. The protection layer is doped with third ions, and a conductivity type of the third ions is the same as a conductivity type of the second ions.

Optionally, the semiconductor structure further includes a stop barrier layer formed on the protection layer and on a sidewall surface of the dummy gate structure, a dielectric layer on the stop barrier layer, and a conductive plug in the dielectric layer, the stop barrier layer and the protection layer.

Another aspect of the present disclosure includes a method for forming a semiconductor structure. The method includes providing a substrate and forming a dummy gate structure on the substrate. The method also includes forming source-drain openings in the substrate on both sides of the dummy gate structure, and forming a first stress layer on a sidewall of a source-drain opening of the source-drain openings. Further, the method includes forming a second stress layer at a bottom of the source-drain opening and on the first stress layer. The second stress layer fully fills the source-drain opening, and stress of the first stress layer is less than stress of the second stress layer.

Optionally, forming the first stress layer includes: forming an initial first stress layer on the sidewall and bottom surfaces of the source-drain opening; and using the dummy gate structure as a mask, etching the initial first stress layer on the bottom surface of the source-drain opening to form the first stress layer on the sidewall of the source-drain opening.

Optionally, the first stress layer is doped with first ions, and the second stress layer is doped with second ions.

Optionally, forming the initial first stress layer includes a selective epitaxial growth process, and doping the initial first stress layer with the first ions includes an in-situ ion doping process.

Optionally, forming the second stress layer includes a selective epitaxial growth process, and doping the second stress layer with the second ions includes an in-situ ion doping process.

Optionally, a conductivity type of the first ions is opposite to a conductivity type of the second ions, or a conductivity type of the first ions is the same as a conductivity type of the second ions.

Optionally, forming the source-drain openings includes using the dummy gate structure as a mask, etching the substrate until a portion of a bottom surface of the dummy gate structure is exposed, to form the source-drain openings in the substrate.

Optionally, etching the substrate includes a wet etching process.

Optionally, after forming the first stress layer and before forming the second stress layer, the method further includes performing an annealing treatment on the first stress layer.

Optionally, the method further includes forming a protection layer on the second stress layer. The protection layer is doped with third ions, and a conductivity type of the third ions is the same as a conductivity type of the second ions.

Optionally, the method further includes forming a stop barrier layer on the protection layer and on a sidewall surface of the dummy gate structure, forming a dielectric layer on the stop barrier layer, and forming a conductive plug in the dielectric layer, the stop barrier layer and the protection layer.

The disclosed embodiments may have following beneficial effects. In the disclosed method for forming the semiconductor structure, the first stress layer may be formed on the sidewall of the source-drain opening. After forming the first stress layer, the second stress layer may be formed at the bottom of the source-drain opening and on the first stress layer. The second stress layer may fully fill the source-drain opening, and the stress of the first stress layer may be less than the stress of the second stress layer.

The first stress layer may be merely formed on the sidewall surface of the source-drain opening, and may occupy a substantially small space of the source-drain opening, which may allow the second stress layer formed in the source-drain opening to have a substantially large volume. The larger the space occupied by the second stress layer, the greater the contribution to the stress of the channel. Therefore, the stress of the second stress layer on the channel may increase, and the driving current of the semiconductor structure may increase. At the same time, because the sidewall of the source-drain opening is close to the channel region, the first stress layer on the sidewall surface of the source-drain opening may reduce the defects at interface between the substrate and the second stress layer, thereby reducing the influence on the channel and improving the short-channel effect. Accordingly, the performance of the formed semiconductor structure may be improved.

Further, the first stress layer may be doped with first ions, and the second stress layer may be doped with second ions, where the conductivity type of the first ions may be opposite to the conductivity type of the second ions. In other words, the conductivity type of the first stress layer may be opposite to the conductivity type of the second stress layer, which may allow the first stress layer to block the second stress layer, may prevent the doped ions in the second stress layer from diffusing into the channel under the dummy gate structure, thereby improving the short-channel effect.

Further, the first stress layer may be doped with first ions, and the second stress layer may be doped with second ions, where the conductivity type of the first ions may be the same as the conductivity type of the second ions. In other words, the conductivity type of the first stress layer may be the same as the conductivity type of the second stress layer. The first stress layer and the second stress layer may together serve as the source-drain doped region in the source-drain opening, which may have a substantially large stress on the channel, thereby increasing the stress of the source-drain doped region on the channel, and increasing the driving current of the semiconductor structure.

In the disclosed semiconductor structure, the first stress layer may be merely formed on the sidewall of the source-drain opening, and may occupy a substantially small space of the source-drain opening, which may allow the second stress layer formed in the source-drain opening to have a substantially large volume. The larger the space occupied by the second stress layer, the greater the contribution to the stress of the channel. Therefore, the stress of the second stress layer on the channel may increase, and the driving current of the semiconductor structure may increase. At the same time, because the sidewall of the source-drain opening is close to the channel region, the first stress layer on the sidewall surface of the source-drain opening may reduce the defects at interface between the substrate and the second stress layer, thereby reducing the influence on the channel and improving the short-channel effect. Accordingly, the performance of the formed semiconductor structure may be improved.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
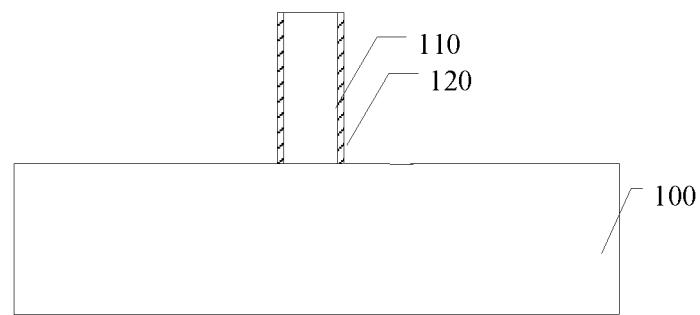
FIGS. 1-4 illustrate schematic diagrams of semiconductor structures corresponding to certain stages for forming a semiconductor structure.

FIGS. 1-4 illustrate schematic diagrams of semiconductor structures corresponding to certain stages for forming a semiconductor structure. Referring to FIG. 1, a substrate 100 is provided. A dummy gate structure 110 is formed on the substrate 100, and a sidewall spacer 120 is formed on both sides of the dummy gate structure 110.

Figure 2:
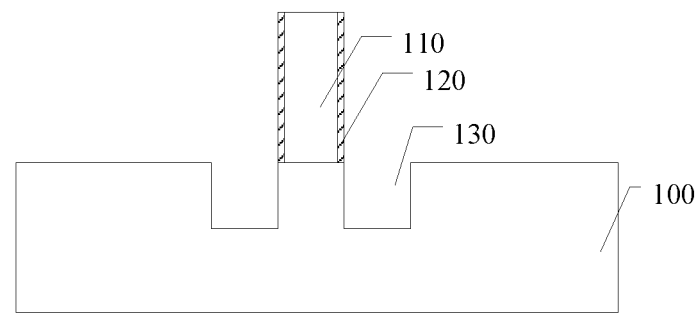

Referring to FIG. 2, source-drain openings 130 are formed in the substrate 100 on both sides of the dummy gate structure 110 and the sidewall spacer 120.

Figure 3:
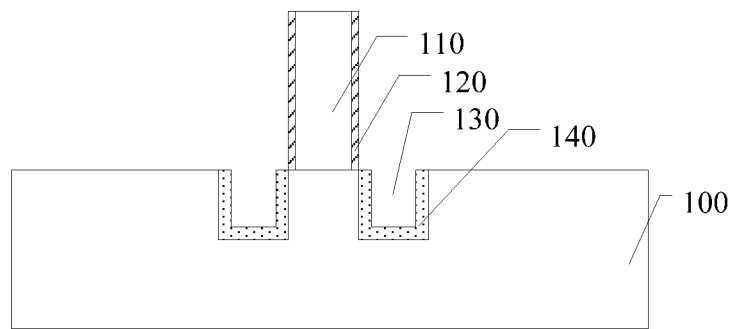
Figure 4:
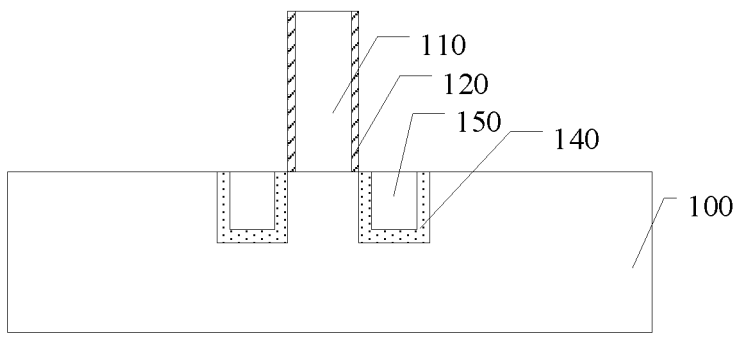

Referring to FIG. 3, a first stress layer 140 is formed at the bottom and on the sidewall surface of the source-drain opening 130. Referring to FIG. 4, a second stress layer 150 is formed on the first stress layer 140. The second stress layer 150 fully fills the source-drain opening 130.

In the above method, when the to-be-formed semiconductor structure is a P-type device, the first stress layer 140 is made of silicon germanium, and the second stress layer 150 is made of silicon germanium. A concentration of germanium in the silicon germanium material of the first stress layer 140 is often less than a concentration of germanium in the silicon germanium material of the second stress layer 150. The first stress layer 140 with a substantially small concentration of germanium is disposed between the substrate 100 and the second stress layer 150, and facilitates to serve as a buffer layer to reduce the interface defects caused by direct contact between the substrate 100 and the second stress layer 150, thereby facilitating to improve the performance of the formed semiconductor structure.

However, because the concentration of germanium in the silicon germanium material of the first stress layer 140 is less than the concentration of germanium in the silicon germanium material of the second stress layer 150, when the first stress layer 140 and the second stress layer 150 have a same volume, the contribution of the first stress layer 140 to stress is smaller than the contribution of the second stress layer 150 to stress. The first stress layer 140 is disposed on the sidewall and bottom surfaces of the source-drain opening 130, and occupies the space for subsequently forming the second stress layer 150. Therefore, the stress of the second stress layer 150 is insufficient, which causes a substantially low driving current of the channel, and, thus, the performance of the formed semiconductor structure is still poor.

The present disclosure provides a semiconductor structure and a method for forming the semiconductor structure. A first stress layer may be formed on a sidewall of a source-drain opening; and a second stress layer may be formed on a bottom surface of the source-drain opening and on the first stress layer. The second stress layer may fully fill the source-drain opening, and the stress of the first stress layer may be less than the stress of the second stress layer. The first stress layer disposed on the sidewall of the source-drain opening may occupy a substantially small space of the source-drain opening while improving the short-channel effect. Therefore, the volume of the second stress layer may be substantially large, which may allow the stress of the second stress layer to be substantially large, and may allow the formed semiconductor structure to have desired performance.

Figure 10:
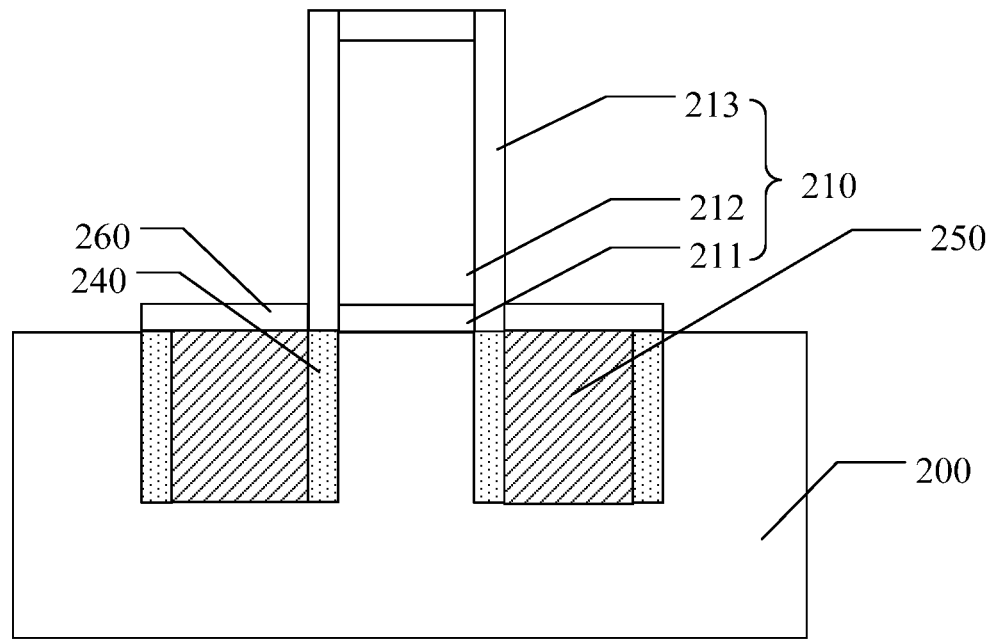
Figure 11:
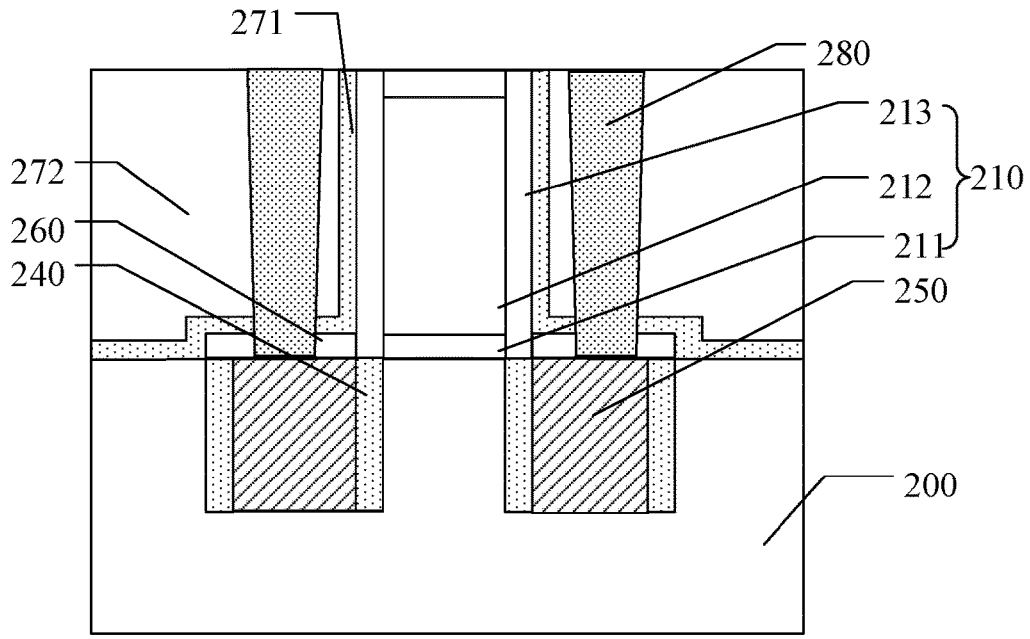
Figure 12:
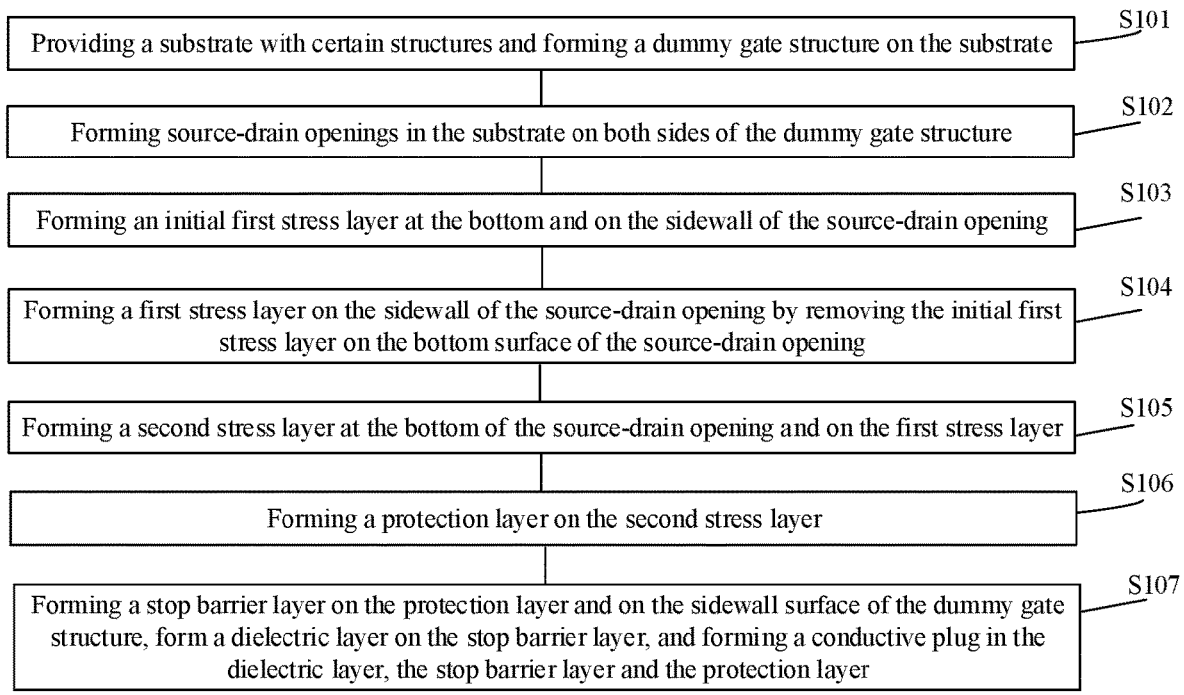
FIG. 12 illustrates a flowchart of an exemplary method for forming a semiconductor structure consistent with various disclosed embodiments of the present disclosure.

FIG. 12 illustrates a flowchart of a method for forming a semiconductor structure consistent with various disclosed embodiments of the present disclosure, and FIGS. 5-11 illustrate semiconductor structures corresponding to certain stages of the fabrication method.

Figure 5:
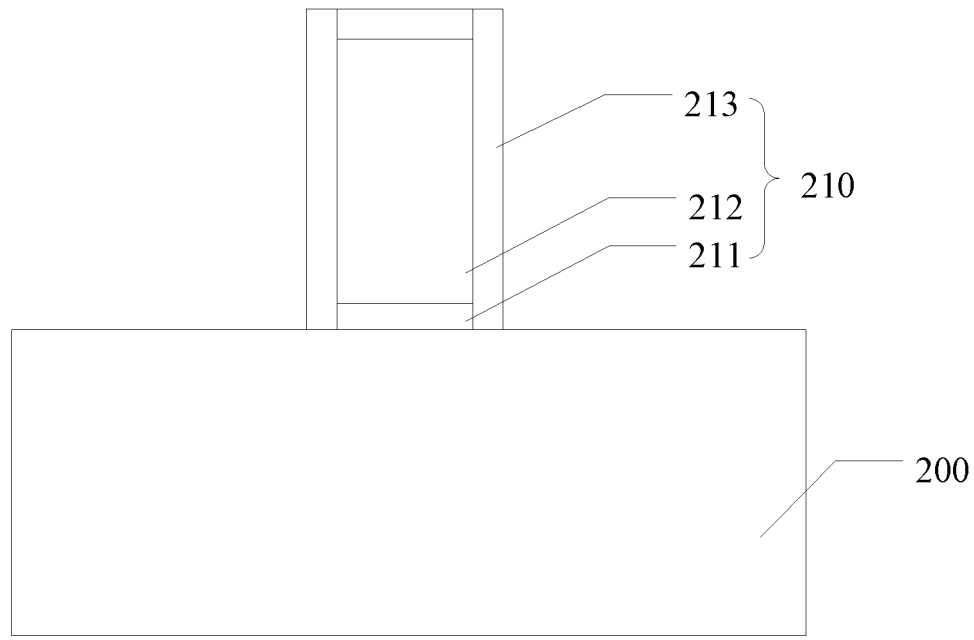
FIGS. 5-11 illustrate schematic diagrams of semiconductor structures corresponding to certain stages for forming an exemplary semiconductor structure consistent with various disclosed embodiments of the present disclosure.

As shown in FIG. 12, at the beginning of the fabrication method, a substrate with certain structures may be provided, and a dummy gate structure may be formed on the substrate (S101). FIG. 5 illustrates a corresponding semiconductor structure.

Referring to FIG. 5, a substrate 200 may be provided, and a dummy gate structure 210 may be formed on the substrate. In one embodiment, the substrate 200 may include a base and a fin on the base. The dummy gate structure 210 may be across the fin, and may cover a portion of the top surface and sidewall surface of the fin. In certain embodiments, the substrate may not include the fin on the base.

In one embodiment, forming the substrate 200 may include: providing an initial base (not illustrated); forming a first patterned layer on the initial base, where the first patterned layer may expose a portion of the initial base; and etching the initial base using the first patterned layer as a mask, to form the base and the fin on the base.

In one embodiment, the initial base may be made of silicon. Correspondingly, the base and the fin may be made of silicon. In certain embodiments, the material of the initial base may include germanium, silicon germanium, silicon-on-insulator, or germanium-on-insulator. Correspondingly, the material of the base may include germanium, silicon germanium, silicon-on-insulator, or germanium-on-insulator. The material of the fin may include germanium, silicon germanium, silicon-on-insulator, or germanium-on-insulator.

In one embodiment, the dummy gate structure 210 may include a dummy gate dielectric layer 211 on a portion of the substrate 200, a dummy gate electrode layer 212 on the dummy gate dielectric layer 211, and a sidewall spacer 213 on the sidewall surfaces of the dummy gate dielectric layer 211 and the dummy gate electrode layer 212.

The dummy gate dielectric layer 211 may be made of a material including one or more of a low-K dielectric material (dielectric constant greater than or equal to 2.5 and less than 3.9) and an ultra-low-K dielectric material (dielectric constant less than 2.5). In one embodiment, the dummy gate dielectric layer 211 may be made of silicon oxide. The dummy gate electrode layer 212 may be made of a material including polysilicon, polycrystalline germanium, or a metal. In one embodiment, the dummy gate electrode layer 212 may be made of polysilicon.

The sidewall spacer 213 may be made of a material including an insulating material. The insulating material may include silicon oxide, silicon nitride, silicon oxynitride, silicon oxycarbide, or silicon oxy-carbo-nitride. In one embodiment, the sidewall spacer 213 may be made of silicon nitride.

Forming the dummy gate structure 210 may include: forming a dummy gate dielectric film (not illustrated) on the substrate; forming a dummy gate electrode film (not illustrated) on the dummy gate dielectric film; patterning the dummy gate dielectric film and the dummy gate electrode film until the surface of the substrate is exposed, where the dummy gate dielectric film may form the dummy gate dielectric layer 211, and the dummy gate electrode film may form the dummy gate electrode layer 212; forming a sidewall spacer material film on the top and sidewall surfaces of the dummy gate electrode layer 212, and on the sidewall surface of the dummy gate dielectric layer 211; and back-etching the sidewall spacer material film until the substrate surface is exposed, to form the sidewall spacer 213 on the sidewall surfaces of the dummy gate dielectric layer 211 and the dummy gate electrode layer 212.

In one embodiment, the method for forming the semiconductor structure may further include forming a barrier layer (not illustrated) on a top surface of the dummy gate structure 210. In one embodiment, the barrier layer may be made of silicon oxide. The barrier layer may be configured to protect the surface of the dummy gate structure 210 from being affected by subsequent process, and, thus, the dummy gate structure 210 may maintain a desired topography.

Figure 6:
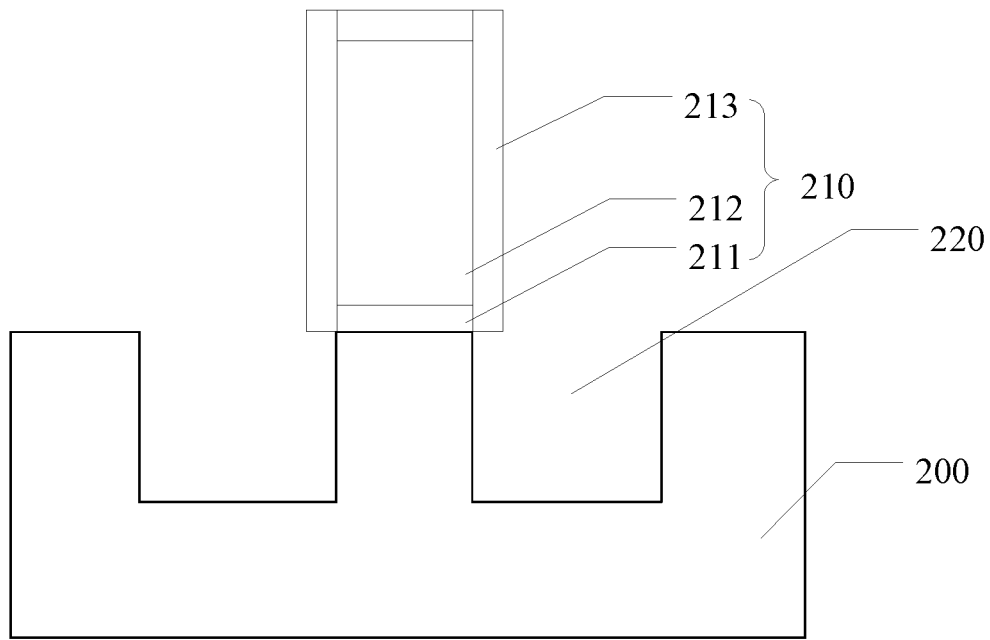

Returning to FIG. 12, after forming the dummy gate structure, source-drain openings may be formed in the substrate on both sides of the dummy gate structure (S102). FIG. 6 illustrates a corresponding semiconductor structure.

Referring to FIG. 6, source-drain openings 220 may be formed in the substrate 200 on both sides of the dummy gate structure 210, respectively. The source-drain opening 220 may provide space for subsequently forming a first stress layer and a second stress layer.

Forming the source-drain openings 220 may include etching the substrate 200 using the dummy gate structure 210 as a mask until a portion of the bottom surface of the dummy gate structure is exposed, to form the source-drain openings 220 in the substrate 200. In one embodiment, etching the substrate 200 may include a wet etching process. The wet etching process may be isotropic, and may be capable of etching the substrate 200 under the dummy gate structure 210, thereby increasing the space of the source-drain opening 220.

In one embodiment, the fin may be etched to expose a bottom surface of the sidewall spacer 213, to form the source-drain openings 220 in the fin. In one embodiment, the source-drain openings 220 may be located in the fin on both sides of the dummy gate structure 210. In one embodiment, the source-drain opening may expose the bottom surface of the sidewall spacer 213.

The source-drain opening 220 may expose the bottom surface of the sidewall spacer 213, such that the source-drain opening 220 may have a substantially large volume, which may facilitate to increase the volume of the second stress layer subsequently formed in the source-drain opening 220. Therefore, the stress of the second stress layer may increase, which may facilitate to increase the driving current of the formed semiconductor structure.

Figure 7:
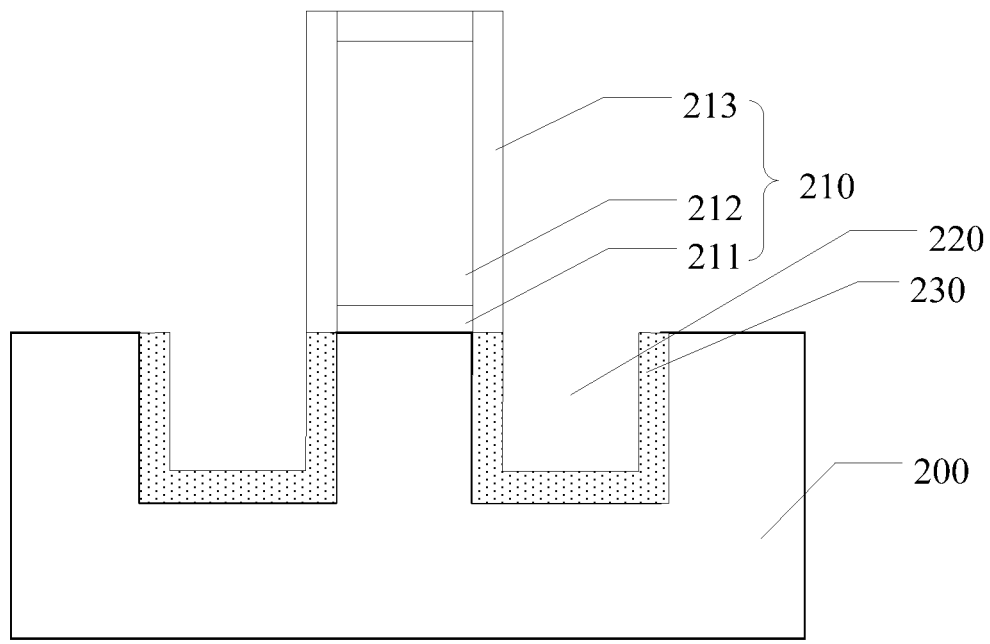

Returning to FIG. 12, after forming the source-drain openings, an initial first stress layer may be formed at the bottom and on the sidewall of the source-drain opening (S103). FIG. 7 illustrates a corresponding semiconductor structure.

Referring to FIG. 7, an initial first stress layer 230 may be formed at the bottom and on the sidewall of the source-drain opening 220. The initial first stress layer 230 may provide material for subsequently forming a first stress layer. The initial first stress layer 230 may be doped with first ions.

Forming the initial first stress layer 230 may include a selective epitaxial growth process. The initial first stress layer 230 may be doped with the first ions using an in-situ ion doping process.

When the to-be-formed semiconductor structure is a P-type device, the initial first stress layer 230 may be made of a material including silicon germanium. When the to-be-formed semiconductor structure is an N-type device, the initial first stress layer 230 may be made of a material including silicon phosphide.

In one embodiment, the to-be-formed semiconductor structure may be a P-type device, and the initial first stress layer 230 may be made of silicon germanium. The concentration of germanium in the silicon germanium material of the initial first stress layer 230 may be a first concentration.

In certain embodiments, the to-be-formed semiconductor structure may be an N-type device, and the initial first stress layer may be made of silicon phosphide. The concentration of phosphorus in the silicon phosphide material of the initial first stress layer may be a first concentration.

The first ion may be an N-type ion or a P-type ion. The N-type ion may include a phosphorus ion or an arsenic ion; and the P-type ion may include a boron ion, an indium ion, or $BF^{2+}$. In one embodiment, the first ion may be a phosphorus ion.

Figure 8:
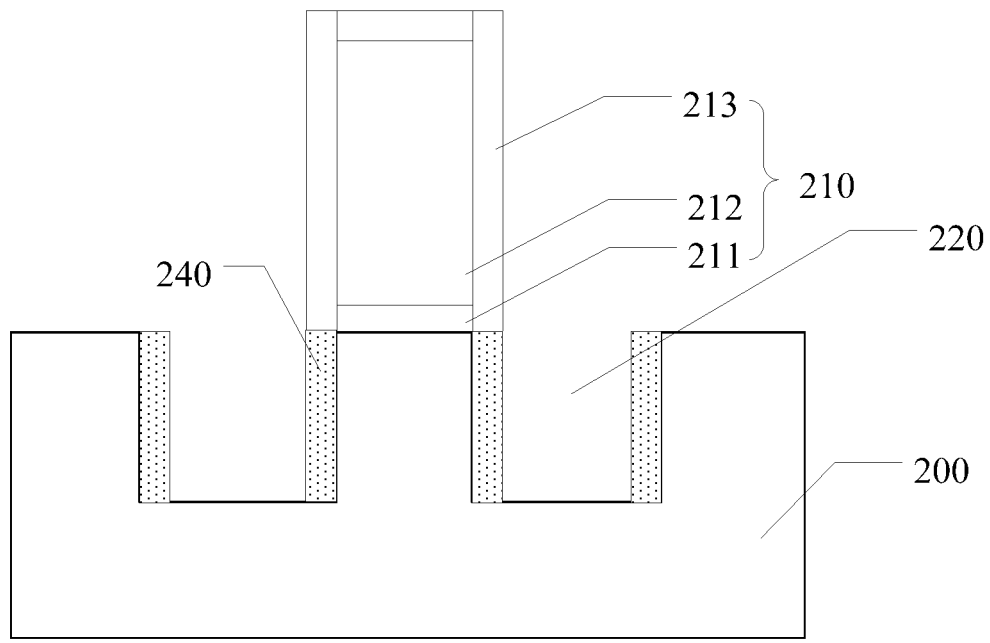

Returning to FIG. 12, after forming the initial first stress layer, a first stress layer may be formed on the sidewall of the source-drain opening by removing the initial first stress layer on the bottom surface of the source-drain opening (S104). FIG. 8 illustrates a corresponding semiconductor structure.

Referring to FIG. 8, the initial first stress layer 230 on the bottom surface of the source-drain opening 220 may be etched using the dummy gate structure 210 as a mask, to form a first stress layer 240 on the sidewall of the source-drain opening 220. The first stress layer 240 may serve as a buffer layer to reduce defects at interface between the substrate 200 and the subsequently formed second stress layer.

In one embodiment, a thickness of the first stress layer 240 may be in a range of approximately 2 nm-8 nm. The thickness of the first stress layer 240 may refer to a dimension of the first stress layer 240 in a direction perpendicular to the sidewall surface of the source-drain opening 220.

If the thickness of the first stress layer is greater than 8 nm, the first stress layer 240 may occupy a substantially large space, which may cause the volume of a second stress layer subsequently formed in the source-drain opening to be substantially small, may cause insufficient stress of the channel, and may cause substantially poor driving current of the formed semiconductor structure. If the thickness of the first stress layer 240 is less than 2 nm, the thickness of the first stress layer may be too thin, which may not facilitate the first stress layer 240 serving as the buffer layer to reduce the defects at interface between the substrate 200 and the subsequently formed second stress layer with a substantially large stress, may not facilitate the short-channel effect, and may cause the electrical performance of the formed semiconductor structure to be substantially poor.

Etching the initial first stress layer 230 on the bottom surface of the source-drain opening 220 may include an anisotropic dry etching process. The etching process may be anisotropic, while removing the initial first stress layer 230 on the bottom surface of the source-drain opening 220 by etching, the etching damage to the initial first stress layer 230 on the sidewall surface of the source-drain opening 220 may be substantially less, and, thus, the first stress layer 240 formed on the sidewall surface of the source-drain opening 220 may satisfy the requirements.

The first stress layer 240 may be formed by etching the initial first stress layer 230. In one embodiment, the first stress layer 240 may be made of silicon germanium. The concentration of germanium in the first stress layer 240 may be a first concentration, and the first concentration may be in a range of approximately 0.1-0.3. In one embodiment, the first concentration may refer to a ratio of the amount of germanium over the amount of silicon in the material.

In one embodiment, the doped first ions in the first stress layer 240 may be phosphorous ions, and a concentration of the phosphorous ions in the first stress layer 240 may be in a range of approximately $1\times10^{18}$ atoms/cm$^3$-$1\times10^{19}$ atoms/cm$^3$.

The first stress layer 240 may be merely formed on the sidewall surface of the source-drain opening 220, and may occupy a substantially small space of the source-drain opening 220, which may allow the second stress layer subsequently formed in the source-drain opening 220 to have a substantially large volume. The larger the space occupied by the second stress layer, the greater the contribution to the stress of the channel. Therefore, the stress of the second stress layer on the channel may increase, and the driving current of the semiconductor structure may increase. At the same time, because the sidewall of the source-drain opening 220 is close to the channel region, the first stress layer 240 on the sidewall surface of the source-drain opening 220 may reduce the defects at interface between the substrate 200 and the second stress layer, thereby reducing the influence on the channel and improving the short-channel effect.

In one embodiment, the method for forming the semiconductor structure may further include: after forming the first stress layer and before subsequently forming the second stress layer, performing an annealing treatment on the first stress layer.

The annealing treatment may include a laser annealing process. The laser annealing process, on the one hand, may be configured to activate the first ions in the first stress layer 240, and on the other hand, may repair the defects at the surface of the source-drain openings 220, which may facilitate to improve the performance of subsequently formed second stress layer.

Figure 9:
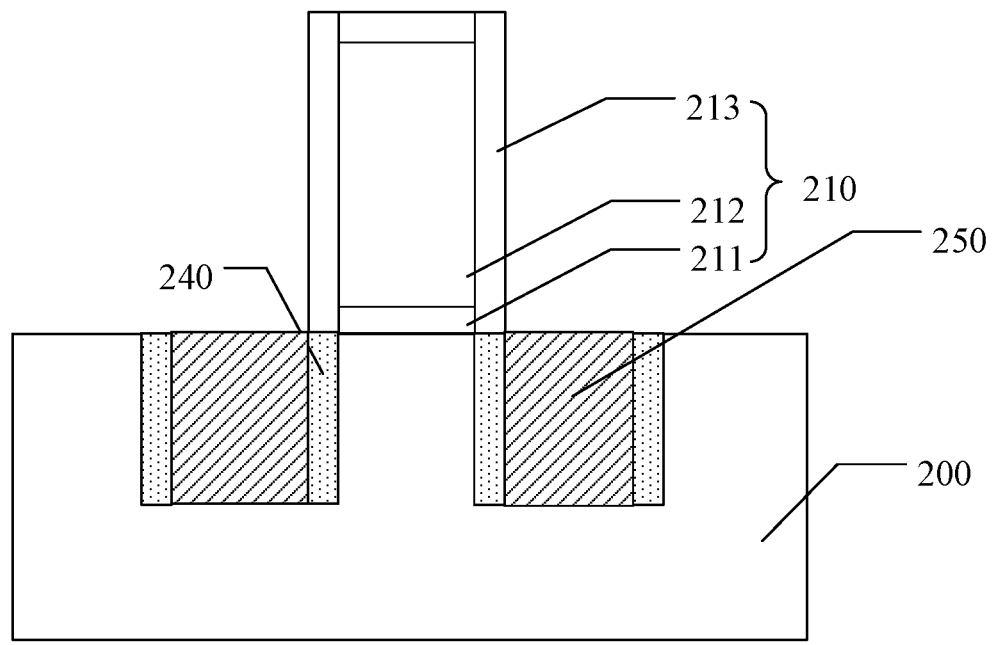

Returning to FIG. 12, after forming the first stress layer, a second stress layer may be formed at the bottom of the source-drain opening and on the first stress layer (S105). FIG. 9 illustrates a corresponding semiconductor structure.

Referring to FIG. 9, a second stress layer 250 may be formed at the bottom of the source-drain opening and on the first stress layer 240. The second stress layer 250 may fully fill the source-drain opening 220, and the stress of the first stress layer 240 may be smaller than the stress of the second stress layer 250.

The second stress layer 250 may be doped with second ions. Forming the second stress layer 250 may include a selective epitaxial growth process. The second stress layer may be doped with second ions using an in-situ ion doping process. The first stress layer 240 may be made of a same material as the second stress layer 250.

In one embodiment, when the to-be-formed semiconductor structure is a P-type device, both the first stress layer 240 and the second stress layer 250 may be made of silicon germanium. The concentration of germanium in the first stress layer may be the first concentration, and the concentration of germanium in the second stress layer may be a second concentration, where the first concentration may be smaller than the second concentration.

In one embodiment, the second stress layer 250 may be made of silicon germanium. The concentration of germanium in the second stress layer may be the second concentration, and the second concentration may be in a range of approximately 0.4-0.6. The second concentration may refer to a ratio of the amount of germanium over the amount of silicon in the material.

The concentration of germanium in the first stress layer 240 may be the first concentration, and the concentration of germanium in the second stress layer 250 may be the second concentration, where the first concentration may be less than the second concentration. Therefore, when the first stress layer and the second stress layer have a same volume, the contribution of the second stress layer 250 to stress may be greater than the contribution of the first stress layer 240 to stress. At the same time, the first stress layer 240 with a substantially low germanium concentration may facilitate to reduce the defects at interface between the substrate 200 and the second stress layer 250, thereby reducing the influence on the channel.

In certain embodiments, when the to-be-formed semiconductor structure is an N-type device, both the first stress layer and the second stress layer may be made of silicon phosphide. The concentration of phosphorus in the first stress layer may be a first concentration, and the concentration of phosphorus in the second stress layer may be a second concentration, where the first concentration may be less than the second concentration.

The second ion may be an N-type ion or a P-type ion. In one embodiment, a conductivity type of the first ions may be opposite to the conductivity type of the second ions. In other words, a conductivity type of the first stress layer 240 may be opposite to a conductivity type of the second stress layer 250, which may allow the first stress layer 240 to block the second stress layer 250, may prevent the doped ions in the second stress layer 250 from diffusing into the channel under the dummy gate structure 210, thereby improving the short-channel effect.

In one embodiment, the second ions may include boron ions, and a concentration of the boron ions may be in a range of approximately $1 \times 10^{20}$ atoms/cm$^3$-$1 \times 10^{21}$ atoms/cm$^3$.

In certain embodiments, the conductivity type of the first ions may be the same as the conductivity type of the second ions. In other words, the conductivity type of the first stress layer may be the same as the conductivity type of the second stress layer. The first stress layer and the second stress layer may together serve as the source-drain doped region in the source-drain opening, which may have a substantially large stress on the channel, thereby increasing the stress of the source-drain doped region on the channel, and increasing the driving current of the semiconductor structure.

Returning to FIG. 12, after forming the second stress layer, a protection layer may be formed on the second stress layer (S106). FIG. 10 illustrates a corresponding semiconductor structure.

Referring to FIG. 10, a protection layer 260 may be formed on the second stress layer 250. The protection layer 260 may be doped with third ions, and a conductivity type of the third ions may be the same as the conductivity type of the second ions.

The protection layer 260 may effectively prevent the stress release of the second stress layer 250 caused by heating during the subsequent thermal process. Forming the protection layer 260 may include a selective epitaxial growth process. The protection layer 260 may be doped with the third ions using an in-situ ion doping process.

When the to-be-formed semiconductor structure is a P-type device, the protection layer 260 may be made of a material including silicon germanium. When the to-be-formed semiconductor structure is an N-type device, the protection layer 260 may be made of a material including silicon phosphide.

The third ion may be an N-type ion or a P-type ion. In one embodiment, the third ion may be a boron ion.

In one embodiment, the protection layer 260 may be made of silicon germanium, the doped third ions may include boron ions, the concentration of germanium in the silicon germanium material of the protection layer 260 may be in a range of approximately 0.1-0.2, and the concentration of the boron ions may be in a range of approximately $5 \times 10^{19}$ atoms/cm$^3$-$5 \times 10^{20}$ atoms/cm$^3$.

Returning to FIG. 12, after forming the protection layer, a stop barrier layer may be formed on the protection layer and on the sidewall surface of the dummy gate structure, a dielectric layer may be formed on the stop barrier layer, and a conductive plug may be formed in the dielectric layer, the stop barrier layer and the protection layer (S107). FIG. 11 illustrates a corresponding semiconductor structure.

Referring to FIG. 11, a stop barrier layer 271 may be formed on the protection layer 260 and on the sidewall surface of the dummy gate structure 210. A dielectric layer 272 may be formed on the stop barrier layer 271. A conductive plug 280 may be formed in the dielectric layer 272, the stop barrier layer 271 and the protection layer 260.

The stop barrier layer 271 may be configured as a stop layer for a subsequent etching. The dielectric layer 272 may be configured to provide support for subsequently forming a device. The stop barrier layer 271 may be made of a material different from the dielectric layer 272. In one embodiment, the stop barrier layer 271 may be made of silicon nitride, and the dielectric layer 272 may be made of silicon oxide.

In one embodiment, a barrier layer (not illustrated) may be formed on the top surface of the dummy gate structure 210. The top surface of the dielectric layer 272 may be coplanar with the top surface of the barrier layer, and the dielectric layer 272 may expose the barrier layer on the top surface of the dummy gate structure 210. In certain embodiments, the dielectric layer may be above the top surface of the dummy gate structure.

The conductive plug 280 may be made of a material including a metal, e.g., one or more of copper, tungsten, aluminum, titanium, nickel, titanium nitride, and tantalum nitride. In one embodiment, the conductive plug 280 may be made of tungsten.

Correspondingly, the present disclosure also provides a semiconductor structure formed by any one of the above-disclosed methods. Referring to FIG. 11, the semiconductor structure may include a substrate 200 and a dummy gate structure 210 on the substrate 200. The substrate contains source-drain openings 220 (illustrated in FIG. 6) in the substrate 200 on both sides of the dummy gate structure 210, respectively. The semiconductor structure may also include a first stress layer 240 on the sidewall of the source-drain opening 220, and a second stress layer 250 at the bottom of the source-drain opening 220 and on the first stress layer 240. The second stress layer 250 may fully fill the source-drain opening 220, and the stress of the first stress layer 240 may be less than the stress of the second stress layer 250.

The first stress layer 240 may be merely formed on the sidewall of the source-drain opening 220, and may occupy a substantially small space of the source-drain opening 220, which may allow the second stress layer 250 formed in the source-drain opening 220 to have a substantially large volume. The larger the space occupied by the second stress layer 250, the greater the contribution to the stress of the channel. Therefore, the stress of the second stress layer on the channel may increase, and the driving current of the semiconductor structure may increase. At the same time, because the sidewall of the source-drain opening 220 is close to the channel region, the first stress layer 240 on the sidewall of the source-drain opening 220 may reduce the defects at interface between the substrate 200 and the second stress layer 250, thereby reducing the influence on the channel and improving the short-channel effect. Therefore, the semiconductor structure may have desired performance.

In one embodiment, the substrate 200 may include a base and a fin on the base. The dummy gate structure may be across the fin, and may cover a portion of the top surface and sidewall surface of the fin.

The first stress layer 240 may be made of a same material as the second stress layer 250. When the to-be-formed semiconductor structure is a P-type device, both the first stress layer 240 and the second stress layer 250 may be made of silicon germanium. The concentration of germanium in the first stress layer may be the first concentration, and the concentration of germanium in the second stress layer may be the second concentration, where the first concentration may be smaller than the second concentration.

When the to-be-formed semiconductor structure is an N-type device, both the first stress layer 240 and the second stress layer 250 may be made of silicon phosphide. The concentration of phosphorus in the first stress layer may be a first concentration, and the concentration of phosphorus in the second stress layer may be a second concentration, where the first concentration may be smaller than the second concentration.

The first stress layer 240 may be doped with first ions, and the second stress layer 250 may be doped with second ions. In one embodiment, a conductivity type of the first ions may be opposite to a conductivity type of the second ions. In certain embodiments, the conductivity type of the first ions may be the same as the conductivity type of the second ions.

The dummy gate structure 210 may include a dummy gate dielectric layer 211 on a portion of the substrate 200, a dummy gate electrode layer 212 on the dummy gate dielectric layer 211, and a sidewall spacer 213 on the sidewall surfaces of the dummy gate dielectric layer 211 and the dummy gate electrode layer 212. The source-drain opening 220 may expose the bottom surface of the sidewall spacer 213.

The semiconductor structure may further include a protection layer 260 on the second stress layer 250. The protection layer 260 may be doped with third ions, and a conductivity type of the third ions may be the same as the conductivity type of the second ions.

The semiconductor structure may further include a stop barrier layer 271 on the protection layer 260 and on the sidewall surface of the dummy gate structure 210, a dielectric layer 272 on the stop barrier layer 271, and a conductive plug 280 in the dielectric layer 272, the stop barrier layer 271 and the protection layer 260.

The disclosed embodiments may have following beneficial effects. In the disclosed method for forming the semiconductor structure, the first stress layer may be formed on the sidewall of the source-drain opening. After forming the first stress layer, the second stress layer may be formed at the bottom of the source-drain opening and on the first stress layer. The second stress layer may fully fill the source-drain opening, and the stress of the first stress layer may be less than the stress of the second stress layer.

The first stress layer may be merely formed on the sidewall surface of the source-drain opening, and may occupy a substantially small space of the source-drain opening, which may allow the second stress layer formed in the source-drain opening to have a substantially large volume. The larger the space occupied by the second stress layer, the greater the contribution to the stress of the channel. Therefore, the stress of the second stress layer on the channel may increase, and the driving current of the semiconductor structure may increase. At the same time, because the sidewall of the source-drain opening is close to the channel region, the first stress layer on the sidewall surface of the source-drain opening may reduce the defects at interface between the substrate and the second stress layer, thereby reducing the influence on the channel and improving the short-channel effect. Accordingly, the performance of the formed semiconductor structure may be improved.

Further, the first stress layer may be doped with first ions, and the second stress layer may be doped with second ions, where the conductivity type of the first ions may be opposite to the conductivity type of the second ions. In other words, the conductivity type of the first stress layer may be opposite to the conductivity type of the second stress layer, which may allow the first stress layer to block the second stress layer, may prevent the doped ions in the second stress layer from diffusing into the channel under the dummy gate structure, thereby improving the short-channel effect.

Further, the first stress layer may be doped with first ions, and the second stress layer may be doped with second ions, where the conductivity type of the first ions may be the same as the conductivity type of the second ions. In other words, the conductivity type of the first stress layer may be the same as the conductivity type of the second stress layer. The first stress layer and the second stress layer may together serve as the source-drain doped region in the source-drain opening, which may have a substantially large stress on the channel, thereby increasing the stress of the source-drain doped region on the channel, and increasing the driving current of the semiconductor structure.

In the disclosed semiconductor structure, the first stress layer may be merely formed on the sidewall of the source-drain opening, and may occupy a substantially small space of the source-drain opening, which may allow the second stress layer formed in the source-drain opening to have a substantially large volume. The larger the space occupied by the second stress layer, the greater the contribution to the stress of the channel. Therefore, the stress of the second stress layer on the channel may increase, and the driving current of the semiconductor structure may increase. At the same time, because the sidewall of the source-drain opening is close to the channel region, the first stress layer on the sidewall surface of the source-drain opening may reduce the defects at interface between the substrate and the second stress layer, thereby reducing the influence on the channel and improving the short-channel effect. Accordingly, the performance of the formed semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
a substrate and a dummy gate structure on the substrate, wherein the substrate contains source-drain openings on both sides of the dummy gate structure;
a first stress layer, formed on a sidewall of a source-drain opening of the source-drain openings; and
a second stress layer, formed at a bottom of the source-drain opening and on the first stress layer, wherein the second stress layer fully fills the source-drain opening, and stress of the first stress layer is less than stress of the second stress layer;
wherein:
in response to a to-be-formed semiconductor structure being a P-type device, both the first stress layer and the second stress layer are made of silicon germanium, and a concentration of germanium in the first stress layer is a first concentration, and a concentration of germanium in the second stress layer is a second concentration, the first concentration being smaller than the second concentration; and
in response to the to-be-formed semiconductor structure being an N-type device, both the first stress layer and the second stress layer are made of silicon phosphide, and a concentration of phosphorus in the first stress layer is a first concentration, and a concentration of phosphorus in the second stress layer is a second concentration, the first concentration being smaller than the second concentration.

2. The semiconductor structure according to claim 1, wherein:
the first stress layer is doped with first ions; and
the second stress layer is doped with second ions.

3. The semiconductor structure according to claim 2, wherein:
a conductivity type of the first ions is opposite to a conductivity type of the second ions, or
a conductivity type of the first ions is the same as a conductivity type of the second ions.

4. The semiconductor structure according to claim 1, wherein:
the dummy gate structure includes a dummy gate dielectric layer on a portion of the substrate, a dummy gate electrode layer on the dummy gate dielectric layer, and a sidewall spacer on sidewall surfaces of the dummy gate dielectric layer and the dummy gate electrode layer; and
the source-drain opening exposes a bottom surface of the sidewall spacer.

5. The semiconductor structure according to claim 2, further including:
a protection layer, formed on the second stress layer, wherein the protection layer is doped with third ions, and a conductivity type of the third ions is the same as a conductivity type of the second ions.

6. The semiconductor structure according to claim 5, further including:

a stop barrier layer, formed on the protection layer and on a sidewall surface of the dummy gate structure,
a dielectric layer on the stop barrier layer, and
a conductive plug in the dielectric layer, the stop barrier layer and the protection layer.

7. A method for forming a semiconductor structure, comprising:
providing a substrate and forming a dummy gate structure on the substrate;
forming source-drain openings in the substrate on both sides of the dummy gate structure;
forming a first stress layer on a sidewall of a source-drain opening of the source-drain openings; and
forming a second stress layer at a bottom of the source-drain opening and on the first stress layer, wherein the second stress layer fully fills the source-drain opening, and stress of the first stress layer is less than stress of the second stress layer;
wherein:
in response to a to-be-formed semiconductor structure being a P-type device, both the first stress layer and the second stress layer are made of silicon germanium, and a concentration of germanium in the first stress layer is a first concentration, and a concentration of germanium in the second stress layer is a second concentration, the first concentration being smaller than the second concentration; and
in response to the to-be-formed semiconductor structure being an N-type device, both the first stress layer and the second stress layer are made of silicon phosphide, and a concentration of phosphorus in the first stress layer is a first concentration, and a concentration of phosphorus in the second stress layer is a second concentration, the first concentration being smaller than the second concentration.

8. The method according to claim 7, wherein forming the first stress layer includes:
forming an initial first stress layer on the sidewall and bottom surfaces of the source-drain opening; and
using the dummy gate structure as a mask, etching the initial first stress layer on the bottom surface of the source-drain opening to form the first stress layer on the sidewall of the source-drain opening.

9. The method according to claim 8, wherein:
the first stress layer is doped with first ions; and
the second stress layer is doped with second ions.

10. The method according to claim 9, wherein:
forming the initial first stress layer includes a selective epitaxial growth process; and
doping the initial first stress layer with the first ions includes an in-situ ion doping process.

11. The method according to claim 9, wherein:
forming the second stress layer includes a selective epitaxial growth process; and
doping the second stress layer with the second ions includes an in-situ ion doping process.

12. The method according to claim 9, wherein:
a conductivity type of the first ions is opposite to a conductivity type of the second ions, or
a conductivity type of the first ions is the same as a conductivity type of the second ions.

13. The method according to claim 7, wherein forming the source-drain openings includes:
using the dummy gate structure as a mask, etching the substrate until a portion of a bottom surface of the dummy gate structure is exposed, to form the source-drain openings in the substrate.

14. The method according to claim 13, wherein:
etching the substrate includes a wet etching process.

15. The method according to claim 7, after forming the first stress layer, and before forming the second stress layer, further including:
performing an annealing treatment on the first stress layer.

16. The method according to claim 9, further including:
forming a protection layer on the second stress layer, wherein the protection layer is doped with third ions, and a conductivity type of the third ions is the same as a conductivity type of the second ions.

17. The method according to claim 16, further including:
forming a stop barrier layer on the protection layer and on a sidewall surface of the dummy gate structure,
forming a dielectric layer on the stop barrier layer, and
forming a conductive plug in the dielectric layer, the stop barrier layer and the protection layer.

\* \* \* \* \*